United States Patent [19]
Shieh et al.

[11] Patent Number: 5,838,705
[45] Date of Patent: Nov. 17, 1998

[54] LIGHT EMITTING DEVICE HAVING A DEFECT INHIBITION LAYER

[75] Inventors: Chang-Long Shieh, Paradise Valley; Wenbin Jiang, Phoenix; Paul Claisse, Gilbert; Craig A. Gaw, Scottsdale, all of Ariz.

[73] Assignee: Motorola, Inc., Schaumburg, Ill.

[21] Appl. No.: 743,288

[22] Filed: Nov. 4, 1996

[51] Int. Cl.⁶ .............................. H01S 3/19; H01S 3/08; H01L 33/00

[52] U.S. Cl. .............................. 372/45; 372/96; 372/46; 257/97; 257/98

[58] Field of Search ................. 372/96, 43, 44, 372/45, 46; 257/18, 97, 98

[56] References Cited

U.S. PATENT DOCUMENTS

| | | | |
|---|---|---|---|
| 4,712,219 | 12/1987 | Yano et al. | 372/45 |
| 4,984,242 | 1/1991 | Scifres et al. | 372/45 |
| 5,038,356 | 8/1991 | Botez et al. | 372/45 |
| 5,048,036 | 9/1991 | Scifres et al. | 372/45 |
| 5,181,221 | 1/1993 | Mori et al. | 372/46 |
| 5,351,256 | 9/1994 | Schneider et al. | 372/45 |
| 5,432,809 | 7/1995 | Grodzinski et al. | 372/45 |
| 5,557,626 | 9/1996 | Grodzinski et al. | 372/45 |
| 5,699,375 | 12/1997 | Paoli | 372/50 |

OTHER PUBLICATIONS

Casey Jr et al, Heterostructure Lasers, Part A: Fundamental Principles, New York: Academic Press, 1978, p. 45, 1978.

*Primary Examiner*—Rodney B. Bovernick
*Assistant Examiner*—Quyen Phan Leung
*Attorney, Agent, or Firm*—Eugene A. Parsons

[57] ABSTRACT

A first stack (112) of distributed Bragg reflectors, a first cladding region (114) disposed on the first stack of distributed Bragg reflectors (112) and including a defect inhibition layer (117) an active area (122) disposed on the first cladding region (114), a second cladding region (132) disposed on the active area (122) and including a defective inhibition layer (136), and a second stack (140) of distributed Bragg reflectors disposed on the second cladding region (132). The defect inhibition layers (117, 136) substantially prevent defects in the active area (122).

7 Claims, 2 Drawing Sheets

LIGHT EMITTING DEVICE HAVING A DEFECT INHIBITION LAYER

FIELD OF THE INVENTION

This invention relates, in general, to optical devices and, more particularly, to light emitting devices.

BACKGROUND OF THE INVENTION

Conventional edge emitting semiconductor lasers have played a significant role in development of optical communications due to their high operating efficiency, small size, and modulation capabilities. However, with increasing performance needs, further reduction in size, and greater manufacturing needs, these devices, have been experiencing limitations.

Recently, there has been an interest in a new type of laser device called a vertical cavity surface emitting laser (VCSEL). Advantages of the VCSEL devices are that the device is smaller, has potentially higher performance, and is potentially more manufacturable. The advantages are due in part from the advances in epitaxial deposition techniques such as metal organic vapor phase epitaxy (MOVPE), and molecular beam epitaxy (MBE), and the like. However, even with these advances in material deposition processes, problems still occur with VCSELs, such as life time reliability, yield, and the like. These problems are in part caused by defects which occur outside the active area of the VCSEL and subsequently migrate into the active area, thereby degrading performance, reducing life time reliability, or in the extreme causing the VCSEL to fail.

It can be readily seen that conventional manufacturing and structural configuration of VCSEL's have several disadvantages and problems, thus not enabling VCSEL's to reach their full performance levels and expectations. Therefore, an article and method of making a VCSEL that prevents defect migration, improves performance, and extends life time would be highly desirable.

It is a purpose of the present invention to provide a new and improved vertical cavity surface emitting laser.

It is another purpose of the present invention to provide a new and improved vertical cavity surface emitting laser which is more reliable and has a longer life.

SUMMARY OF THE INVENTION

The above problems and others are at least partially solved and the above purposes and others are realized in a light emitting device having a defect inhibition layer. The light emitting device includes a first stack of distributed Bragg reflectors including alternating layers of differing refractive indexes with the first stack of distributed Bragg reflectors having a first dopant type and a first concentration, a first cladding region disposed on the first stack of distributed Bragg reflectors, an active area disposed on the first cladding region, a second cladding region disposed on the active area, and a second stack of distributed Bragg reflectors disposed on the second cladding region, the second stack of distributed Bragg reflectors including alternating layers of differing refractive indexes with the second stack of distributed Bragg reflectors having a second dopant type and a second dopant concentration. A defect inhibition area including indium is positioned in at least one of the first and second cladding regions. Basically, the defect inhibition area prevents the migration of defects in the active region.

BRIEF DESCRIPTION OF THE DRAWINGS

Referring to the drawings.

DESCRIPTION OF THE PREFERRED EMBODIMENTS

Figure 1:
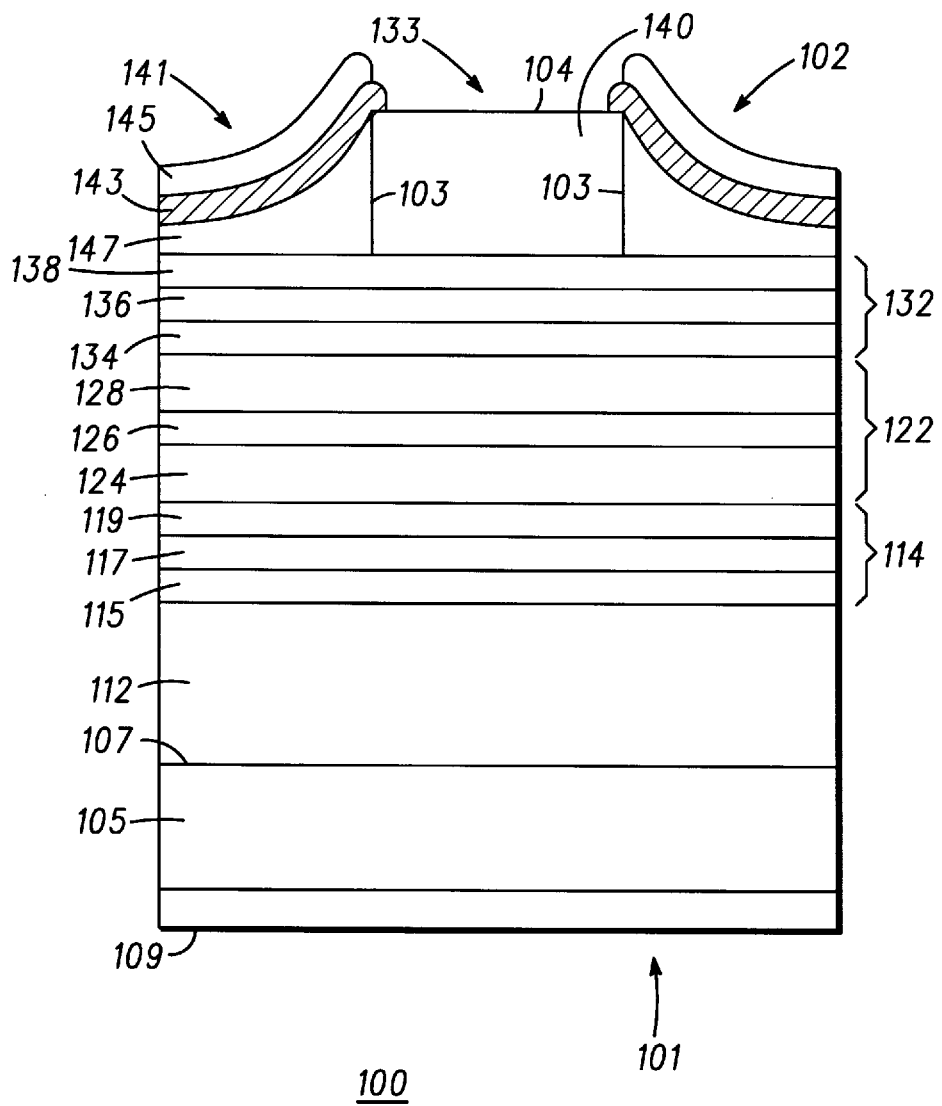
FIG. 1 is a simplified sectional view of a ridge VCSEL with defect inhibition layers.

FIG. 1 illustrates a light emitting device 100 that includes defect inhibition areas. While light emitting device 100 is illustrated in FIG. 1 as a ridge VCSEL 101, it should be understood that light emitting device 100 can also be an edge emitting laser. As shown in FIG. 1, ridge VCSEL 101 has a plurality of elements or features, including a substrate 105 having a surface 107, a contact region 109, a stack 112 of distributed Bragg reflectors having a plurality of alternating layers of material that differ in refractive index by at least 0.05, a cladding region 114 having a transition layer 115, a defect inhibition area which in this embodiment is a layer 117, and a transition layer 119, an active area 122 having a barrier region 124, a quantum well region 126, and barrier region 128, a cladding region 132 having a transition layer 134, another defect inhibition area which in this embodiment is a layer 136, and a transition layer 138, a stack 140 of distributed Bragg reflectors having a plurality of alternating layers of material that differ in refractive index by at least 0.05, a contact region 141, a conductive layer 143, and an insulative layer 145. As shown in FIG. 1, ridge VCSEL 101 also includes an insulative layer 147 and a ridge or mesa 102 having sidewalls 103, and a surface 104.

It should be understood that FIG. 1 is a simplified illustration and that many elements have been purposefully omitted to more clearly illustrate the present invention. Further, it should be noted that FIG. 1 is a sectional view, thereby depicting light emitting device 100 extending into and out of the figure. Thus, light emitting device 100 can be used to represent an array of light emitting devices formed on substrate 105.

Generally, as shown in FIG. 1, ridge VCSEL 101 is made by any suitable well-known method in the art. Briefly, ridge VCSEL 101 is fabricated on any suitable substrate 105 having surface 107. Generally, substrate 105 is made of any suitable semiconductive material, such as gallium arsenide, indium phosphide, silicon, or the like. Stack 112 of distributed Bragg reflectors, cladding region 114, active area 122, cladding region 132, and stack 140 of distributed Bragg reflectors are epitaxially deposited overlying surface 107 by any suitable method, such as molecular beam epitaxy (MBE), metal organic vapor phase epitaxy (MOVPE) or the like. In ridge VCSEL 1, ridge 102 is formed by any suitable method well known in the art, such as photolithography, etching, deposition, any combination thereof, or the like.

In ridge VCSEL 101, a defect inhibition layer, or layers, illustrated by defect inhibition layers 117 and 136, are formed anywhere outside active area 122. By way of example, defect inhibition layers 117 and 136 are disposed in close proximity and on either side of active area 122, thereby providing a barrier that does not allow defects to pass through and into active area 122. With the epitaxial deposition of stack 112 of distributed Bragg reflectors being completed, cladding region 114 is epitaxially disposed on stack 112 by any suitable method in the art, such as MOVPD, MBE, or the like. As shown in FIG. 1, cladding region 114 includes transition layers 115, 119, and defect inhibition layer 117. Transition layer 115 is disposed on stack 112, with defect inhibition layer 117 disposed on transition layer 115, and with transition layer 119 disposed on defect inhibition layer 117.

Transition layers 115 and 119 are made of any suitable material, such as, gallium arsenide (GaAs), aluminum gallium arsenide (AlGaAs), gallium indium phosphide (GaInP), or the like so as to facilitate the epitaxial deposition of a subsequent layer. The thickness of transition layers 115 and 119 ranges from 100 to 20,000 Angstroms with a preferred range from 200 to 2,000 Angstroms, and a nominal range from 240 to 500 Angstroms.

Defect inhibition layers 117 and 136 are made of any suitable indium containing material, such as indium gallium arsenide (InGaAs), indium gallium arsenide phosphide (InGaAsP), indium gallium phosphide (InGaP), or the like, that induces a strain into light emitting device 100. It is believed that the strain either prohibits movement of defects to active area 122 or attracts defects and subsequently traps the defects in defect inhibition layers 117 and 136. It should be understood that depending upon material selection, the thickness of defect inhibition layers 117 and 136 can vary widely. By way of example, with defect inhibition layers 117 and 136 being made of an indium containing material, the thickness of defect inhibition layer 117 ranges from a monomolecular layer, i.e., the thickness of one molecule to 1,000 Angstroms with a preferred range from 100 to 800 Angstroms, and a nominal range from 200 to 500 Angstroms.

However, it should be understood that while cladding regions 114 and 132 are shown to include transition layers 115, 119 and 134, 138 these layers are not necessary for the practice of the present invention in all cases. Generally, transition layers 115, 119 and 134, 138 are deposited to facilitate the deposition of subsequent material layers and the confinement of carriers in active region 122. Thus, depending upon the materials selected for stack 112 of distributed Bragg reflectors, for stack 140 of distributed Bragg reflectors, and for barrier regions 124 and 128, transition layers 115, 119, 134, and 138 may not be necessary.

Once cladding region 114 has been epitaxially deposited on stack 112 of distributed Bragg reflectors, active area 122 is formed or disposed on cladding region 114. Active area 122, in its simplest form, is made of two barrier regions 124 and 128 and quantum well region 126. Typically, active area 122 is made by any suitable method well known in the art. Additionally, it should be understood that active area 122 can be made more complex, i.e., many more quantum well regions and barrier regions can be used to make active area 122, thereby increasing the optical gain of ridge VCSEL 101.

Barrier regions 124 and 128 are made of any suitable material, such as aluminum gallium arsenide (AlGaAs), indium gallium arsenide phosphide (InGaAsP), indium aluminum gallium phosphide (InAlGaP), or the like. Further, barrier regions 124 and 128 are made with any suitable thickness ranging from 10 to 600 Angstroms, with a preferred thickness ranging from 50 to 500 Angstroms, and a nominal thickness ranging from 70 to 200 Angstroms.

Quantum well region 126 is made of any suitable material well known in the art, such as GaAs, indium gallium arsenide (InGaAs), aluminum gallium arsenide (AlGaAs), or the like. Quantum well region 126 is made with any suitable thickness ranging from 10 to 200 Angstroms, with a preferred thickness ranging from 50 to 150 Angstroms, and a nominal thickness ranging from 70 to 120 Angstroms.

Once active area 122 has been formed, cladding region 132 is formed on active area 122. Cladding region 132 is formed by disposing a transition layer 134 on the active area 122, disposing defect inhibition layer 136 on transition layer 134 and disposing transition layer 138 on defect inhibition layer 136. Cladding region 132 and cladding region 114 are made of similar materials and thickness and, since cladding region 114 has previously been described, a repetition of that description will not be given here.

Stack 140 of distributed Bragg reflectors is subsequently deposited on cladding region 132. Generally, stack 140 is made of a plurality of alternating layers of material having differing refractive indexes that are well known in the art and as described with reference to stack 112 of distributed Bragg reflectors.

Contact region 141 is made by any suitable epitaxial deposition method. Typically, contact region 141 is made of any suitable material, such heavily doped GaAs, GaInP, or the like that allows light originating in active area 122 to pass through cladding region 132, stack 140 of distributed Bragg reflectors, and contact region 141. Additionally, contact region 141 is generally doped such that an ohmic contact is made between conductive layer 143 and stack 140 of distributed Bragg reflectors.

Once stack 140 of distributed Bragg reflectors is completed, ridge 102 is made by any suitable well-known method in the art, such as photolithography, etching, lift-off, any combination thereof, or the like. By defining ridge 102 in stack 140 of distributed Bragg reflectors, an optical path is defined in stack 140 that reflects and guides light formed in active area 122.

Insulative layer 147, which is made of any suitable dielectric material, such as nitride, oxynitride, oxide, or the like, is deposited on substrate 105, thereby overlying structures previously described. Typically, insulative layer 147 is deposited as a conformal layer, thereby insulative layer 147 conforms to ridge 102. Insulative layer 147 is then patterned to expose surface 104 of ridge 102 while the remaining portions of insulative layer 147 passivate or insulate structures where insulative layer 147 remains as shown in FIG. 1.

Conductive layer 143, which is made of any suitable electrically conductive material or alloys, such as titanium tungsten, titanium gold, gold, geranium gold, aluminum, silver, or the like, is then deposited on the structure. Conductive layer 143 is then subsequently patterned to expose surface 104 of stack 140 of distributed Bragg reflectors, thus conductive layer 143 provides both an opening 133 which exposes surface 104, as well as making an electrical contact to stack 140 of distributed Bragg reflectors. Further, it should be understood that an electrical contact to stack 112 of distributed Bragg reflectors is generally achieved through a contact region 109 on the reverse side of substrate 105.

Figure 2:
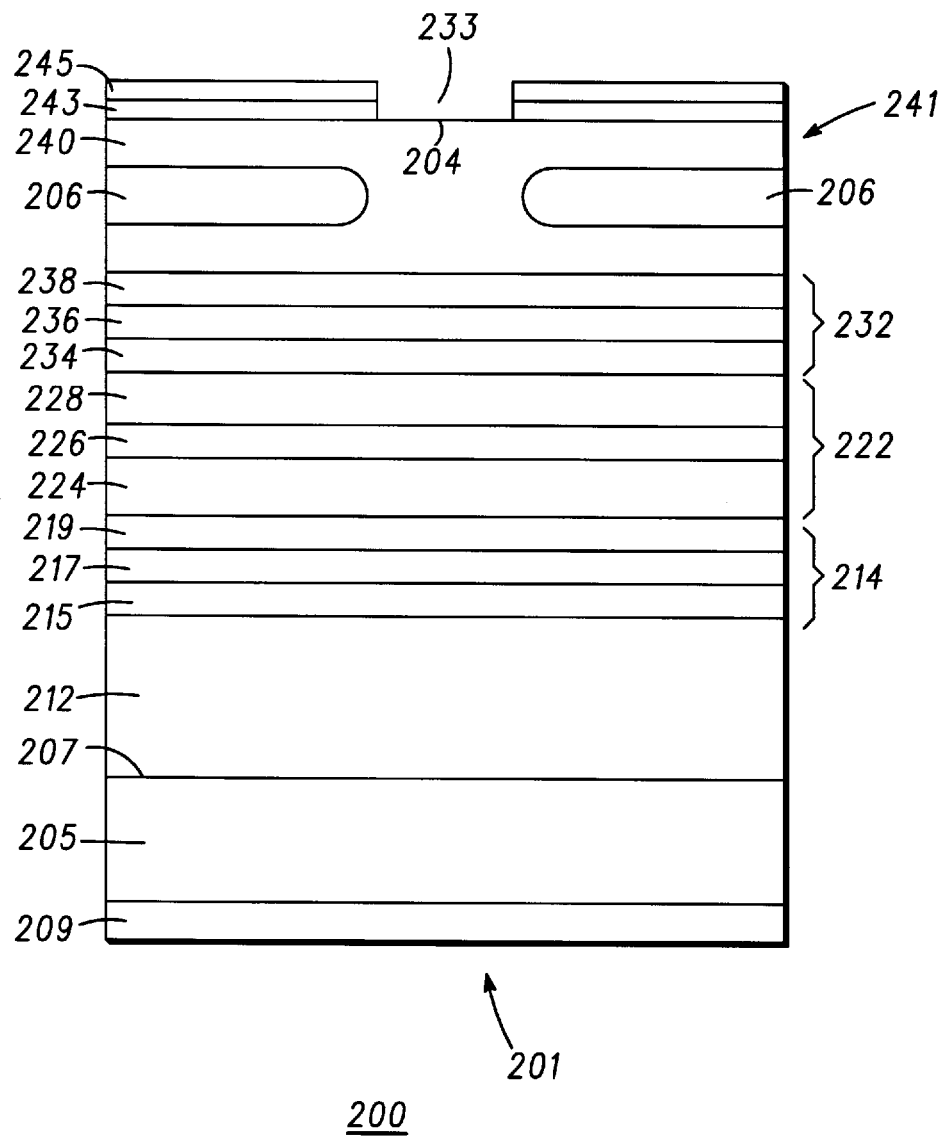
FIG. 2 is a simplified sectional view of a planar VCSEL with defect inhibition layers.

While light emitting device 100 is illustrated in FIG. 1 as a ridge VCSEL 101, it should be understood that another light emitting device 200 can also be a planar VCSEL 201, as illustrated in FIG. 2. As shown in FIG. 2, planar VCSEL 201 has a plurality of elements or features, including a substrate 205 having a surface 207, a contact region 209, a stack 212 of distributed Bragg reflectors having a plurality of alternating layers of material that differ in refractive index by at least 0.05, a cladding region 214 having a transition layer 215, defect inhibition layer 217, and a transition layer 219, an active area 222 having a barrier region 224, a quantum well region 226, and barrier region 228, a cladding region 232 having a transition layer 234, a defect inhibition layer 236, and a transition layer 238, a stack 240 of distributed Bragg reflectors having a plurality of alternating layers of material that differ in refractive index by at least 0.05, a contact region 241, a conductive layer 243, and an insulative layer 245. Whereas ridge VCSEL 101 includes insulative layer 147 and ridge 102, planar VCSEL 201 includes a damaged region 206 positioned in stack 240 so as to define an optical light path and a current path.

As explained above, FIG. 2 is a simplified illustration and many elements have been purposely omitted to more clearly illustrate the present invention. Further, it should be noted that FIG. 2 is a sectional view, thereby depicting light emitting device 200 extending into an out of the figure. Thus, light emitting device 200 can be used to represent an array of light emitting devices formed on substrate 205.

Portions of planar VCSEL 201 which are similar to portions of ridge VCSEL 101 are constructed as described above. Further, damaged region 206 is formed by any suitable method well known in the art, such as photolithography, deposition, ion implantation, any combination thereof, or the like.

As a typical example, once the epitaxial depositions are complete, an ion implant mask (not shown) is formed on stack 240 of distributed Bragg reflectors. The ion implant mask is fabricated by any suitable well-known method in the art such as photolithography, deposition, etching, combination thereof, or the like. The ion implant mask provides openings which expose portions of stack 240 of distributed Bragg reflectors while covering or protecting other portions of stack 140. Typically, the ion implant mask is shaped in a dot pattern. That is, islands of the ion implant mask are placed on stack 240. Once the ion implant mask is formed, stack 240 is ion implanted by any suitable well-known method in the art. Generally, ion implantation injects ions through the exposed surface of stack 240, while the ion implant mask protects and does not allow the ions to penetrate into the covered surface of stack 240. When the ions pass through the surface and come to rest in stack 240, they cause damage in the crystal lattice structure which results in damaged region 206. Because damaged region 206 does not conduct current as readily as where there is no damage, the current is confined to areas where there is no damage.

Contact region 241 is made by any suitable epitaxial deposition method. Typically, contact region 241 is made of any suitable material, such heavily doped GaAs, GaInP, or the like that allows light originating in active area 222 to pass through cladding region 232, stack 240 of distributed Bragg reflectors, and contact region 241. Additionally, contact region 241 is generally doped such that an ohmic contact is made between conductive layer 243 and stack 240 of distributed Bragg reflectors.

Once planar VCSEL 201 has been formed, a series of depositions and patterning steps are performed to fabricate conductive layer 243 and an insulative layer 245. Generally, the depositions are performed by any suitable well-known method in the art, such as chemical vapor deposition (CVD), plasma enhanced chemical vapor deposition (PECVD), sputtering, or the like. In addition, the patterning steps also are performed by any suitable well-known method in the art, such as photolithography, lift-off, etching, or combination thereof, or the like.

Conductive layer 243 is then deposited on the surface of contact region 241 of stack 240. Conductive layer 143 is made of any suitable electrically conductive material or alloys, such as titanium tungsten, titanium gold, gold, geranium gold, aluminum, silver, or the like. Conductive layer 243 is then subsequently patterned to expose surface 204 of stack 240, thus conductive layer 243 provides both an opening 233 which exposes surface 204, as well as making an electrical contact which electrically couples conductive layer 243 to stack 240. Also, electrical contact to stack 212 of distributed Bragg reflectors is generally achieved through contact region 209 on the lower surface of substrate 205.

By now it should be appreciated that a novel VCSEL and method for making the same have been provided. A light emitting device now has a defect inhibition layer which prevents defects from migrating into the active region, thereby maintaining high performance levels, as well as increasing the life time of the device. Additionally, since the defect inhibition layer is integrated in the process flow of the light emitting device, the light emitting device is highly manufacturable, thus reducing overall costs and allowing significant improvements in reliability and quality.

While we have shown and described a specific embodiment of the present invention, further modification and improvement will occur to those skilled in the art. We desire it to be understood, therefore, that this invention is not limited to the particular forms shown and we intend in the appended claims to cover all modification that does not depart from the spirit and scope of this invention.

What is claimed is:

1. A light emitting device having a defect inhibition layer comprising:

a first stack of distributed Bragg reflectors including alternating layers of differing refractive indexes with the first stack of distributed Bragg reflectors having a first dopant type and a first concentration;

a first cladding region disposed on the first stack of distributed Bragg reflectors;

an active area disposed on the first cladding region;

a second cladding region disposed on the active area;

the first and second cladding regions and the active area being formed of material selected from the group GaAs and AlGaAs;

a second stack of distributed Bragg reflectors disposed on the second cladding region, the second stack of distributed Bragg reflectors including alternating layers of differing refractive indexes with the second stack of distributed Bragg reflectors having a second dopant type and a second dopant concentration; and a defect inhibition area including a thin layer formed of one of indium gallium arsenide, indium gallium arsenide phosphide and indium gallium phosphide positioned within one of the first and second cladding regions.

2. A light emitting device having a defect inhibition layer as claimed in claim 1 wherein the defect inhibition area is a layer of material with a thickness in a range from a monomolecular layer to 1,000 Angstroms.

3. A vertical cavity surface emitting laser having a defect inhibition layer as claimed in claim 1 wherein the first stack of distributed Bragg reflectors includes alternating layers made of aluminum gallium arsenide having alternating concentrations of aluminum.

4. A vertical cavity surface emitting laser having a defect inhibition layer as claimed in claim 1 wherein the second stack of distributed Bragg reflectors includes alternating layers made of aluminum gallium arsenide having alternating concentrations of aluminum.

5. A vertical cavity surface emitting laser having a defect inhibition layer as claimed in claim 1 wherein the first plurality of alternating layers of differing refractive indexes differ by at least 0.05.

6. A vertical cavity surface emitting laser having a defect inhibition layer as claimed in claim 1 wherein the second plurality of alternating layers of differing refractive indexes differ by at least 0.05.

7. A vertical cavity surface emitting laser having a defect inhibition layer comprising:
- a first stack of distributed Bragg reflectors including a first plurality of alternating layers having differing refractive indexes with the first stack of distributed Bragg reflectors having a first dopant type and a first concentration;
- a first cladding region disposed on the first stack of distributed Bragg reflectors, the first cladding region including a first gallium arsenide layer, a first indium gallium arsenide layer, and a second gallium arsenide layer, the first gallium arsenide layer being disposed on the first stack of distributed Bragg reflectors, the first indium gallium arsenide layer being disposed on the first gallium arsenide layer, and the second gallium arsenide layer being disposed on the first indium gallium arsenide layer;
- an active area disposed on the first cladding region the active area being formed of a material selected from the group GaAs and AlGaAs;
- a second cladding region disposed on the active area, the second cladding region including a third gallium arsenide layer, a second indium gallium arsenide layer, and a fourth gallium arsenide layer, the third gallium arsenide layer being disposed on the active area, the second indium gallium arsenide layer being disposed on the third gallium arsenide layer, and the fourth gallium arsenide layer being disposed on the second indium gallium arsenide layer; and
- a second stack of distributed Bragg reflectors disposed on the second cladding region, the second stack of distributed Bragg reflectors having a second plurality of alternating layers having differing refractive indexes with the second stack of distributed Bragg reflectors having a second dopant type and a second dopant concentration.

* * * * *